US012765119B2

(12) United States Patent
Wang

(10) Patent No.: US 12,765,119 B2
(45) Date of Patent: Oct. 13, 2026

(54) DISPLAY MODULE, FABRICATION METHOD AND REPAIR METHOD THEREOF

(71) Applicant: MACROBLOCK, INC., Hsinchu City (TW)

(72) Inventor: Mei Tan Wang, Hsinchu City (TW)

(73) Assignee: MACROBLOCK, INC., Hsinchu City (TW)

( * ) Notice: Subject to any disclaimer, the term of this patent is extended or adjusted under 35 U.S.C. 154(b) by 586 days.

(21) Appl. No.: 18/129,799

(22) Filed: Mar. 31, 2023

(65) Prior Publication Data

US 2024/0282885 A1 Aug. 22, 2024

(30) Foreign Application Priority Data

Feb. 22, 2023 (TW) ................................ 112106462

(51) Int. Cl.
*H10H 20/01* (2025.01)
*H10H 20/857* (2025.01)
*H10W 90/00* (2026.01)

(52) U.S. Cl.
CPC .......... *H10H 20/01* (2025.01); *H10H 20/857* (2025.01); *H10W 90/00* (2026.01); *H10H 20/0364* (2025.01)

(58) Field of Classification Search
CPC ... H01L 25/0753; H10H 20/01; H10H 20/857
See application file for complete search history.

(56) References Cited

U.S. PATENT DOCUMENTS

| | | | | |
|---|---|---|---|---|
| 8,890,325 | B2 | 11/2014 | Kang et al. | |
| 10,909,911 | B1 | 2/2021 | Zheng et al. | |
| 2017/0358562 | A1 | 12/2017 | Banna et al. | |
| 2021/0341534 | A1* | 11/2021 | Chen | H01L 21/76871 |
| 2021/0398865 | A1* | 12/2021 | Lin | H10P 74/273 |
| 2022/0120826 | A1* | 4/2022 | Chen | G01R 31/67 |
| 2022/0123188 | A1* | 4/2022 | Chen | H10D 86/60 |
| 2025/0374739 | A1* | 12/2025 | Asad | H10H 29/962 |

* cited by examiner

*Primary Examiner* — Jeff W Natalini
*Assistant Examiner* — Rose Keagy
(74) *Attorney, Agent, or Firm* — Maschoff Brennan

(57) ABSTRACT

A display module includes a substrate, an interposer and at least one micro light emitting element. The substrate has a driving circuit. The interposer includes an interlayer, a testing circuit and an electrically conductive structure. The testing circuit and the electrically conductive structure are located at the interlayer, and the driving circuit is electrically connected with the electrically conductive structure. The micro light emitting element is located at the interposer. The micro light emitting element is electrically connected with the testing circuit and the electrically conductive structure.

14 Claims, 5 Drawing Sheets

DISPLAY MODULE, FABRICATION METHOD AND REPAIR METHOD THEREOF

CROSS-REFERENCE TO RELATED APPLICATIONS

This application claims priority under 35 U.S.C. § 119(a) on Patent Application No(s). 112106462 filed in Taiwan, R.O.C. on Feb. 22, 2023, the entire contents of which are hereby incorporated by reference.

BACKGROUND

1. Technical Field

This present disclosure relates to a display module, more particularly to a display module including micro light emitting element, a method for fabricating the display module, and a method for repairing the display module once the micro light emitting element is found to be defective.

2. Related Art

With the improvement of optoelectronics technology, the size of optoelectronic devices is gradually reduced. Micro light emitting diodes (Micro LED) enjoy the advantages of high efficiency, long service life, and relative stability due to its materials not easily influenced by the environment. Therefore, a display device containing micro LED arrays are gradually gaining attention in the market.

To achieve lower production costs, the manufacturing of a display device containing micro LED arrays typically involves mass transfer technique. The micro LEDs which have been fabricated are firstly transferred to a temporary substrate, and then transferred to a target substrate having driving circuit according to actual requirements.

A conventional mass transfer technique commonly uses mechanical robot arms or laser separation to transfer one or multiple micro LEDs to the target substrate. However, due to the miniaturization of micro LEDs and the increasing size of display panels, the transfer efficiency of the conventional mass transfer technique is no longer sufficient to meet demands.

SUMMARY

According to one embodiment of the present disclosure, a display module includes a substrate, an interposer and at least one micro light emitting element. The substrate has a driving circuit. The interposer includes an interlayer, a testing circuit and an electrically conductive structure. The testing circuit and the electrically conductive structure are located at the interlayer, and the driving circuit is electrically connected with the electrically conductive structure. The micro light emitting element is located at the interposer. The micro light emitting element is electrically connected with the testing circuit and the electrically conductive structure.

According to one embodiment of the present disclosure, a method for fabricating display module includes the following steps: providing a semi-finished product of a display module, wherein the semi-finished product includes an interposer and at least one micro light emitting element, the interposer includes an interlayer, a testing circuit and an electrically conductive structure, the testing circuit and the electrically conductive structure are located at the interlayer, the micro light emitting element is located at the interposer, and the micro light emitting element is electrically connected with the testing circuit and the electrically conductive structure; performing an electrical test procedure, wherein a testing signal is transmitted to the at least one micro light emitting element through the testing circuit to determine quality of the at least one micro light emitting element; and performing a bonding procedure if the at least one micro light emitting element is determined to be qualified, wherein the electrically conductive structure is electrically connected with a driving circuit of a substrate.

According to one embodiment of the present disclosure, a method for repairing display module includes the following steps: providing the aforementioned display module; performing an electrical test procedure, wherein a testing signal is transmitted to the at least one micro light emitting element through the testing circuit to determine quality of the at least one micro light emitting element; and performing a repairing procedure if the at least one micro light emitting element is determined to be unqualified, wherein the interposer is separated from the substrate, and a replacement of the interposer is connected with the substrate.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
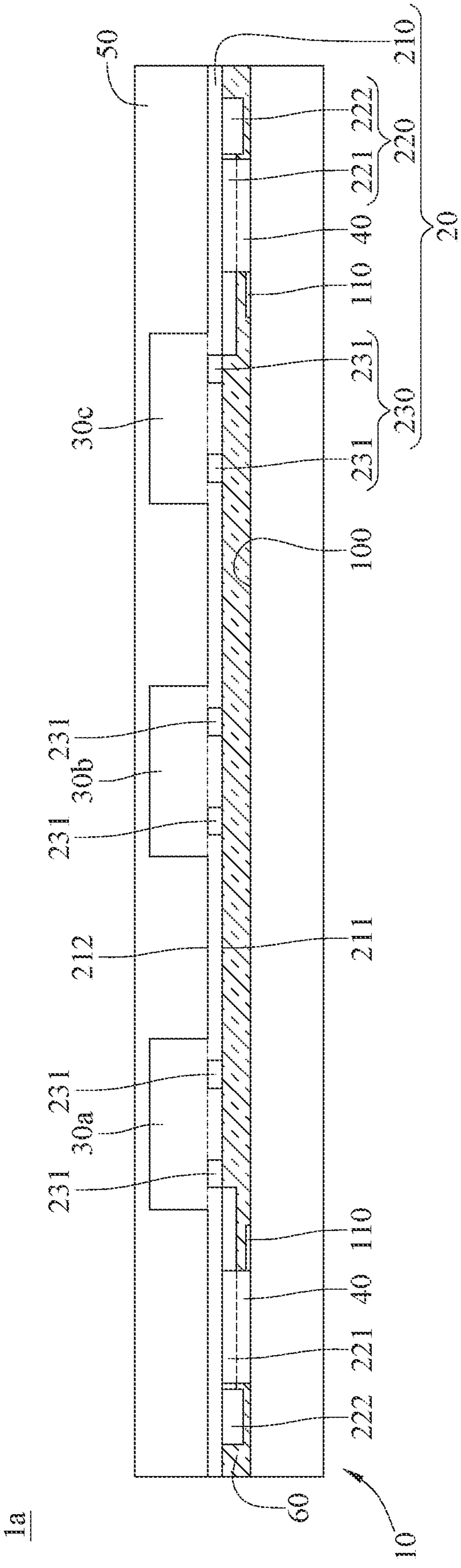
FIG. 1 is a schematic view of a display module according to a first embodiment of the present disclosure.

According to one embodiment of the present disclosure, a display module may include a substrate, an interposer and at least one micro light emitting element. Please refer to FIG. 1 showing a schematic view of a display module according to a first embodiment of the present disclosure. In this embodiment, the display module 1*a* includes a substrate 10, an interposer 20 and at least one micro light emitting element.

The substrate 10 is, for example, but not limited to, a glass substrate, a silicon substrate, a printed circuit board, a ceramic circuit board or a metal substrate, and the substrate 10 may be a target substrate where the interposer and the at least one micro light emitting element are transferred. The substrate 10 may has a driving circuit 110. The driving circuit 110 may be a metal pattern formed on a surface of the substrate 10, or a metal layer formed in the substrate 10 with its section exposed to outside. The substrate 10, as a target substrate, may be configured to receive one or more micro light emitting elements transferred by a temporary substrate (not shown in the drawings). The term "target substrate" refers to a substrate where specific element can be permanently mounted, instead of a temporary substrate.

The interposer 20 includes an interlayer 210, a testing circuit 220 and an electrically conductive structure 230. The interlayer 210 is, for example, but not limited to, a silicon plate or a glass plate. The testing circuit 220 and the electrically conductive structure 230 are located at the interlayer 210, and the driving circuit 110 is electrically connected with the electrically conductive structure 230.

The micro light emitting element is, for example but not limited to, a micro LED located on the interposer 20. The micro light emitting element is electrically connected with the testing circuit 220, and the micro light emitting element is also electrically connected with the electrically conductive structure 230. FIG. 1 exemplarily depicts the display module 1*a* includes a red micro light emitting element 30*a*, a green micro light emitting element 30*b* and a blue micro light emitting element 30*c*, and the three micro light emitting elements 30*a*. 30*b*, and 30*c* together configure a pixel of the display module 1*a*, but the present disclosure is not limited thereto. In some other embodiments, the display module may include single micro light emitting element or more than three micro light emitting elements. Alternatively, the display module may include multiple micro light emitting elements which emit the same color of visible light. In some other embodiments, each micro light emitting element may emit other colors of visible light such as white light or yellow-green light.

According to one embodiment of the present disclosure, the electrically conductive structure of the interposer may extend through the interlayer. As shown in FIG. 1, the electrically conductive structure 230 of the interposer 20 include a plurality of conductive vias 231 extending through the interlayer 210. Each of the micro light emitting elements 30*a*, 30*b* and 30*c* is electrically connected with at least one of the conductive vias 231.

According to one embodiment of the present disclosure, the micro light emitting element may be one-piece formed on the interposer. As shown in FIG. 1, the micro light emitting elements 30*a*. 30*b* and 30*c* are one-piece formed on the interlayer 210 of the interposer 20. More specifically, the micro light emitting elements 30*a*, 30*b* and 30*c* may be grown on the interlayer 210 by an epitaxial growth process. In such a case, the interlayer 210 may be preferably a silicon wafer.

According to one embodiment of the present disclosure, the testing circuit may be formed on the surface of the interlayer. As shown in FIG. 1, the interlayer 210 of the interposer 20 has a first surface 211 and a second surface 212 opposite to each other, and the first surface 211 faces toward the substrate 10. The testing circuit 220 is located on the first surface 211, and the micro light emitting elements 30*a*, 30*b*, 30*c* are formed on the second surface 212. More specifically, the testing circuit 220 includes a circuitry 221 and a testing pad 222. A testing signal can be transmitted from the testing pad 222 to the micro light emitting elements 30*a*, 30*b* and 30*c* through the circuitry 221 so as to determine the quality of each of the micro light emitting elements 30*a*, 30*b*, and 30*c*. Any testing pad 222 may be electrically connected with each of the micro light emitting elements 30*a*, 30*b*, and 30*c*. In some other embodiment, multiple testing pads 222 may be electrically connected with respective micro light emitting elements so as to enable independent testing of each micro light emitting element.

According to one embodiment of the present disclosure, the display module may further include an electrical connection element between the substrate and the interlayer. As shown in FIG. 1, the display module 1*a* further includes at least one electrical connection element 40 between the substrate 10 and the interlayer 210. The electrical connection element 40 may include metal solder such as lead, tin and alloys thereof. The driving circuit 110 is electrically connected with the electrically conductive structure 230 through the electrical connection element 40. More specifically, one end of the electrical connection element 40 is electrically connected to the exposed section of the driving circuit 110, and opposite end of the electrical connection element 40 is electrically connected to the conductive vias 231 of the electrically conductive structure 230 through a circuitry (not shown in the drawings) on the interlayer 210. FIG. 1 exemplarily depicts the display module 1*a* includes two electrical connection elements 40, while the present disclosure is not limited by the number of the electrical connection elements 40.

According to one embodiment of the present disclosure, a projection of the at least one micro light emitting element onto a surface of the substrate may not overlap a projection of the electrical connection element onto the surface. As shown in FIG. 1, any one of the micro light emitting elements 30*a*, 30*b*, 30*c* defines a first projection on the surface 100 of the substrate 10, any one of the electrical connection elements 40 defines a second projection on the surface 100, and the first projection does not overlap the second projection.

According to one embodiment of the present disclosure, the display module may further include a protective layer disposed on the interposer. As shown in FIG. 1, the display module 1*a* further include a protective layer 50 disposed on the interposer 20. The protective layer 50 is, for example but not limited to, a polyimide film or a light cured resin covering the micro light emitting elements 30*a*, 30*b*, 30*c*. The protective layer 50 and the testing circuit 220 of the interposer 20 are located on opposite sides of the interlayer 210. More specifically, the protective layer 50 and the micro light emitting elements 30*a*, 30*b*, and 30*c* are located on the second surface 212 of the interlayer 210.

According to one embodiment of the present disclosure, the display module may further include a buffer layer. As shown in FIG. 1, the display module 1*a* further includes a buffer layer 60 between the substrate 10 and the interlayer 210. The buffer layer 60 is, for example but not limited to, a light cured resin or an organic material layer with certain degree of elasticity or viscosity.

Figure 2:
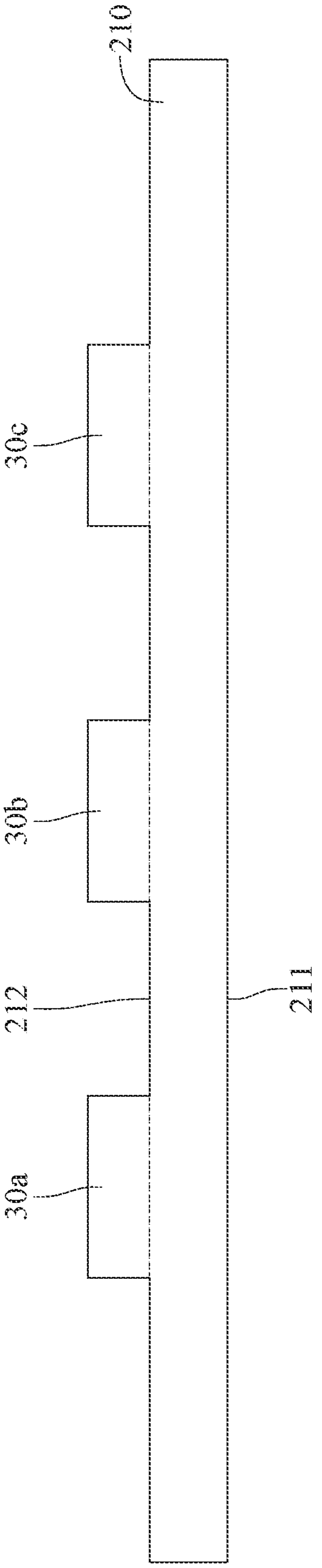
FIG. 2 through FIG. 5 are schematic views of fabricating the display module in FIG. 1.
Figure 3:
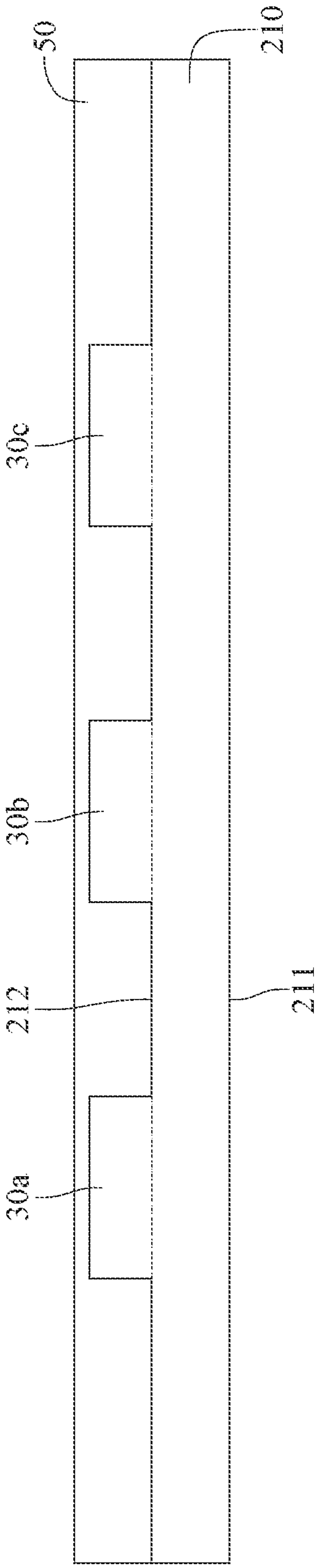

The present disclosure further provides a method for fabricating the display module 1*a*. FIG. 2 through FIG. 5 are schematic views of fabricating the display module in FIG. 1. Referring to FIG. 2, the interlayer 210 is provided, and the micro light emitting elements 30*a*, 30*b* and 30*c* are grown on the interlayer 210 by an epitaxial growth process. Then, the protective layer 50 is formed to cover the micro light emitting elements 30*a*, 30*b* and 30*c*, as can be referred to FIG. 3. The protective layer 50 is helpful to prevent the micro light emitting elements 30*a*, 30*b*, and 30*c* from unfavorable influence by moisture or dust.

Figure 4:
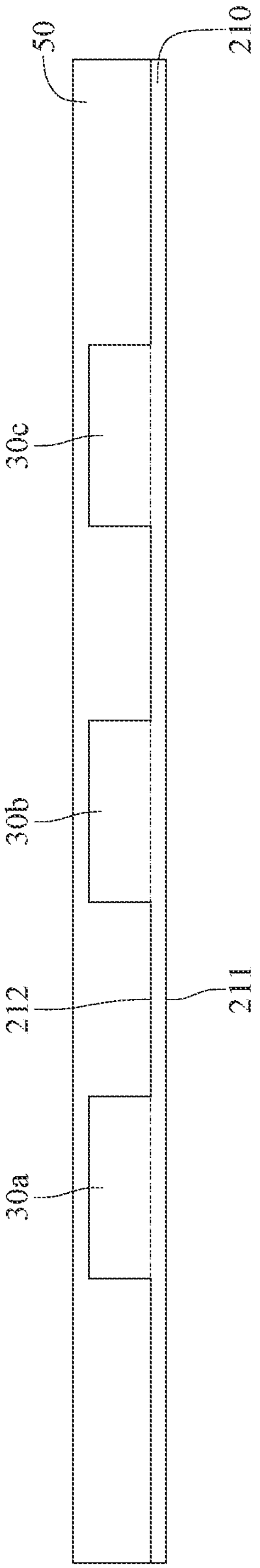

Referring to FIG. 4, a thinning procedure is optionally performed to reduce the thickness of the interlayer 210. Specifically, the thickness of the interlayer 210 is reduced to a thickness suitable for forming the electrically conductive structure in a subsequent step. In this embodiment, the thickness of the interlayer 210 may be reduced to below about 100 microns (μm) by, for example, an etching process or a grinding process.

Figure 5:
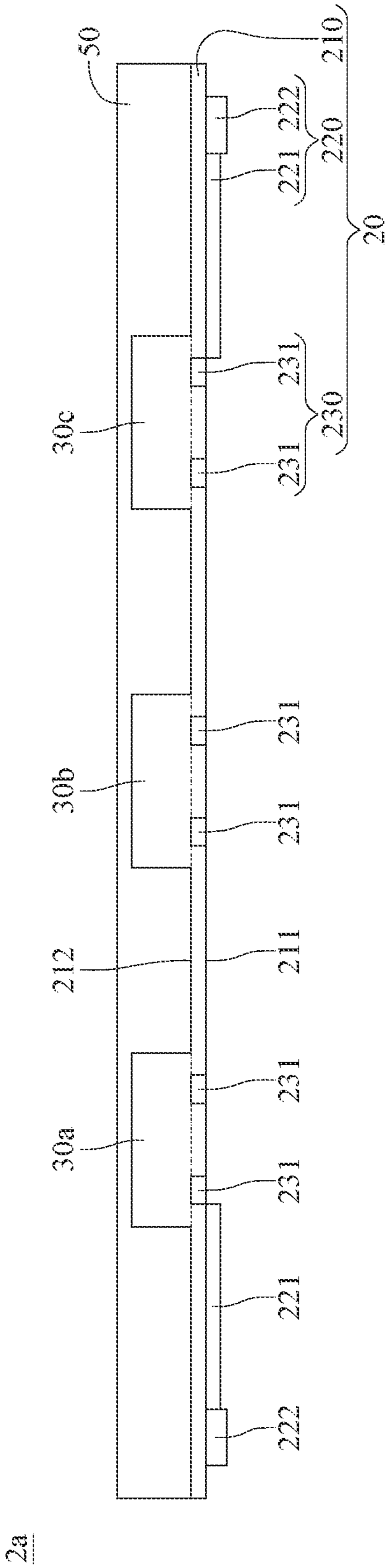

Referring to FIG. 5, the testing circuit 220 and the electrically conductive structure 230 are formed on the interlayer 210. Specifically, one or more though holes are formed in the interlayer 210, and the though holes are filled with metal material or coated with metal film so as to obtain the conductive vias 231 electrically connected with the micro light emitting elements 30*a*, 30*b*, and 30*c*. Moreover, the circuitry 221 and the testing pads 222 of the testing circuit 220 are formed on the first surface 211 of the interlayer 210, and the micro light emitting elements 30*a*, 30*b*, 30*c* are electrically connected with the circuitry 221. The assembly containing the interposer 20 (the interlayer 210, the testing circuit 220 and the electrically conductive structure 230) and the micro light emitting elements 30*a*, 30*b*, 30*c* may be considered as a semi-finished product 2*a* of the display module in this embodiment.

Then, an electrical test procedure is performed by transmitting testing signals to the micro light emitting elements 30*a*, 30*b* and 30*c* through the testing circuit 220 to determine quality of each of the micro light emitting elements 30*a*, 30*b* and 30*c*. More specifically, each of the testing pads 222 of the testing circuit 220 serves as test point to allow the input of testing signals. An external device (not shown in the drawings) provides the testing signals to the micro light emitting elements 30*a*, 30*b*, and 30*c* through the testing circuit 220. Specifically, some electrical signals with specific voltage or current values can be applied to each of the micro light emitting elements 30*a*, 30*b*, and 30*c* by the testing circuit 220. For each of the micro light emitting elements 30*a*, 30*b* and 30*c*, the micro light emitting element is determined as qualified micro light emitting element if it emits light with required intensity under the application of the testing signals. On the other hand, if no light is emitted or the light intensity is insufficient under the application of the testing signals, the micro light emitting element is determined as unqualified micro light emitting element. Said "qualified" element may also be interpreted as good element, non-defective element and/or acceptable element in this technical field.

If the micro light emitting elements 30*a*, 30*b* and 30*c* are determined to be qualified, a bonding procedure is performed to electrically connect the electrically conductive structure 230 with driving circuit 110 of the substrate 10 so as to obtain the display module 1*a* as shown in FIG. 1. Specifically, the electrical connection element 40 is provided between the substrate 10 and the interposer 20, and the electrical connection element 40 connects the driving circuit 110 with the conductive vias 231 of the electrically conductive structure 230 to allow the driving circuit 110 to transmit driving signals to the micro light emitting element 30*a*, 30*b*, 30*c* through the electrical connection element 40 and the electrically conductive structure 230. Each of the micro light emitting element 30*a*, 30*b* and 30*c* can be independently driven by the driving circuit 110 to emit light.

A buffer layer 60 may be provided on the surface 100 of the substrate 10 or the first surface 211 of the interlayer 210 prior to the aforementioned bonding procedure. Since the bonding procedure may apply pressure on the substrate 10 or the interposer 20 in order to improve bonding quality, the buffer layer 60 is additionally provided to protect the interposer 20, thereby preventing unfavorable deformation or cracking of the interlayer 210 due to excessive pressure.

During the aforementioned electrical test procedure, if any micro light emitting element is determined to be unqualified, the semi-finished product including this unqualified micro light emitting element can be scrapped, or a repairing process can be performed to replace this unqualified micro light emitting element. In this embodiment, assuming that the micro light emitting element 30*a* in FIG. 5 is unqualified, semi-finished product 2*a* of the display module can be scrapped, and another semi-finished product with all qualified micro light emitting elements can be provided for the subsequent bonding procedure.

Figure 6:
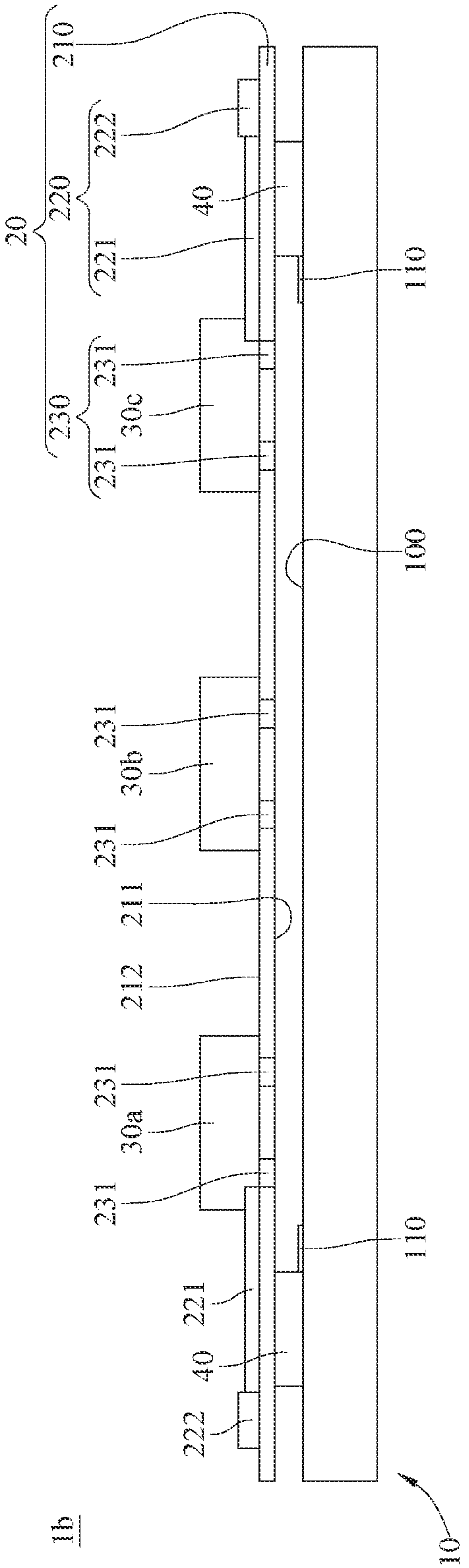
FIG. 6 is a schematic view of a display module according to a second embodiment of the present disclosure.

FIG. 6 is a schematic view of a display module according to a second embodiment of the present disclosure. In this embodiment, the display module 1*b* includes a substrate 10, an interposer 20, a plurality of micro light emitting elements 30*a*, 30*b*, 30*c* and an electrical connection element 40. The primary differences between this embodiment and the first embodiment will be described hereafter.

Compared to the display module 1*a* in FIG. 1, each of the micro light emitting elements 30*a*, 30*b* and 30*c* is an independent element from the interlayer 210 of the interposer 20 in the display module 1*b*. As shown in FIG. 6, the micro light emitting elements 30*a*, 30*b* and 30*c* are bonded to the electrically conductive structure 230 of the interlayer 210. More specifically, the micro light emitting elements 30*a*, 30*b* and 30*c* can be transferred from a temporary substrate (not shown in the drawings) to the interposer 20.

Compared to the display module 1*a* in FIG. 1, the testing circuit 220 of the interposer 20 and the micro light emitting elements 30*a*, 30*b*, and 30*c* are all located on the second surface 212 in the display module 1*b*.

Compared to the display module 1*a* in FIG. 1, the display module 1*b* does not include a protective layer for covering the micro light emitting elements, and thus, the micro light emitting elements 30*a*. 30*b*, 30*c* are exposed to external environment. Moreover, a buffer layer may be optionally provided between the substrate 10 and the interlayer 210. FIG. 6 exemplarily depicts the display module 1*b* without buffer layer.

Figure 7:
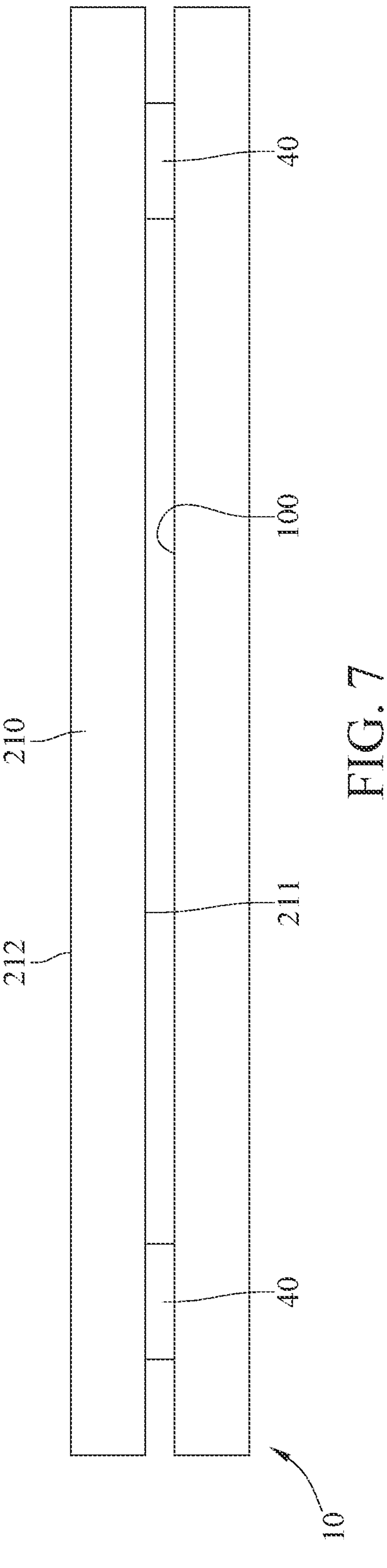
FIG. 7 through FIG. 9 are schematic views of fabricating the display module in FIG. 6.
Figure 8:
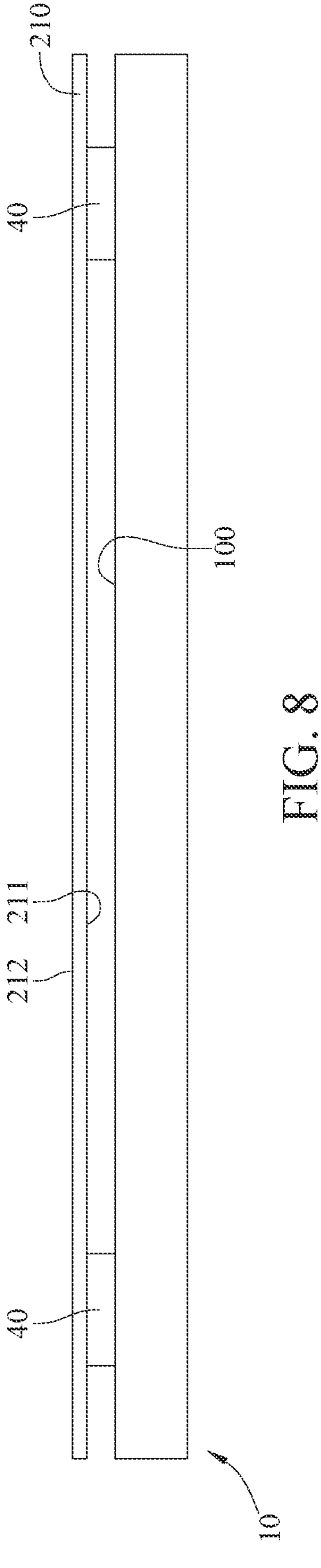
Figure 9:
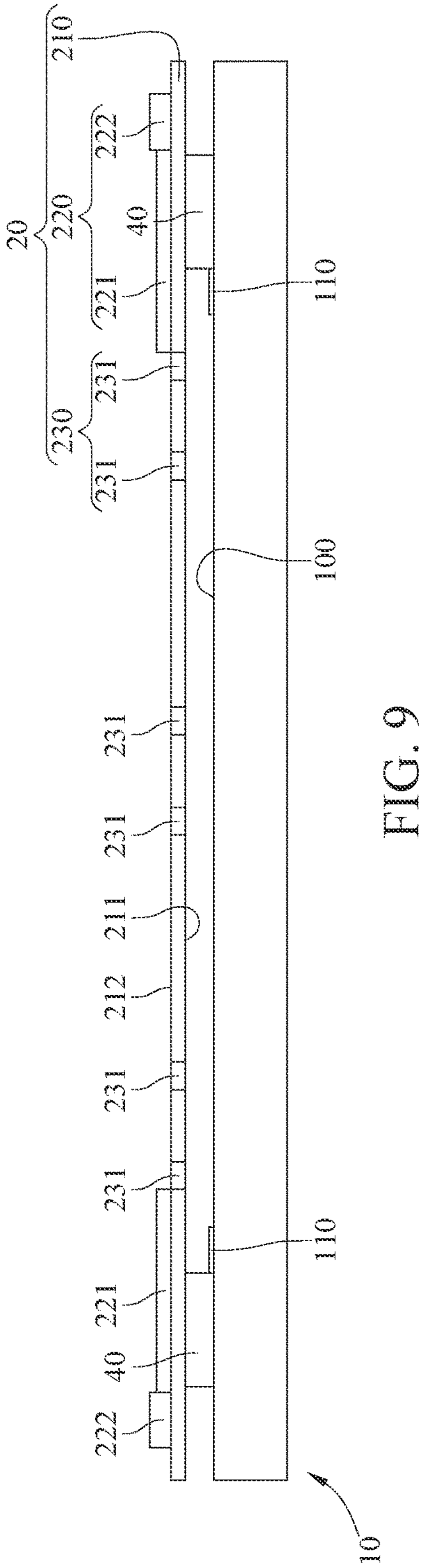

FIG. 7 through FIG. 9 are schematic views of fabricating the display module in FIG. 6. Referring to FIG. 7, the substrate 10 is bonded with the interlayer 210. Specifically, the electrical connection element 40 is provided between the substrate 10 and the interlayer 210, and the substrate 10 is bonded with the interlayer 210 through the electrical connection element 40. More specifically, the electrical connection element 40 includes tin solder, and the substrate 10 is bonded with the interlayer 210 by a soldering process.

Referring to FIG. 8, a thinning procedure is optionally performed to reduce the thickness of the interlayer 210. Specifically, the thickness of the interlayer 210 is reduced to a thickness suitable for forming the electrically conductive structure in a subsequent step. In this embodiment, the thickness of the interlayer 210 may be reduced to below about 100 microns (μm) by, for example, an etching process or a grinding process.

Referring to FIG. 9, the testing circuit 220 and the electrically conductive structure 230 are formed on the interlayer 210. Specifically, one or more though holes are formed in the interlayer 210, and the though holes are filled with metal material or coated with metal film so as to obtain the conductive vias 231 electrically connected with the micro light emitting elements 30*a*, 30*b* and 30*c*. Moreover, the circuitry 221 and the testing pads 222 of the testing circuit 220 are formed on the second surface 212 of the interlayer 210, and the micro light emitting elements 30*a*, 30*b*, 30*c* are electrically connected with the circuitry 221. The conductive vias 231 are electrically connected with the electrical connection element 40. The micro light emitting elements 30*a*, 30*b* and 30*c* are bonded with the electrically conductive structure 230 to obtain the display module 1*b* in FIG. 6.

An electrical test procedure may be performed to determine quality of each of the micro light emitting elements 30*a*, 30*b* and 30*c*. More specifically, each of the testing pads 222 of the testing circuit 220 serves as test point to allow the input of testing signals. An external device (not shown in the drawings) provides the testing signals to the micro light emitting elements 30*a*, 30*b*, and 30*c* through the testing circuit 220.

Figure 10:
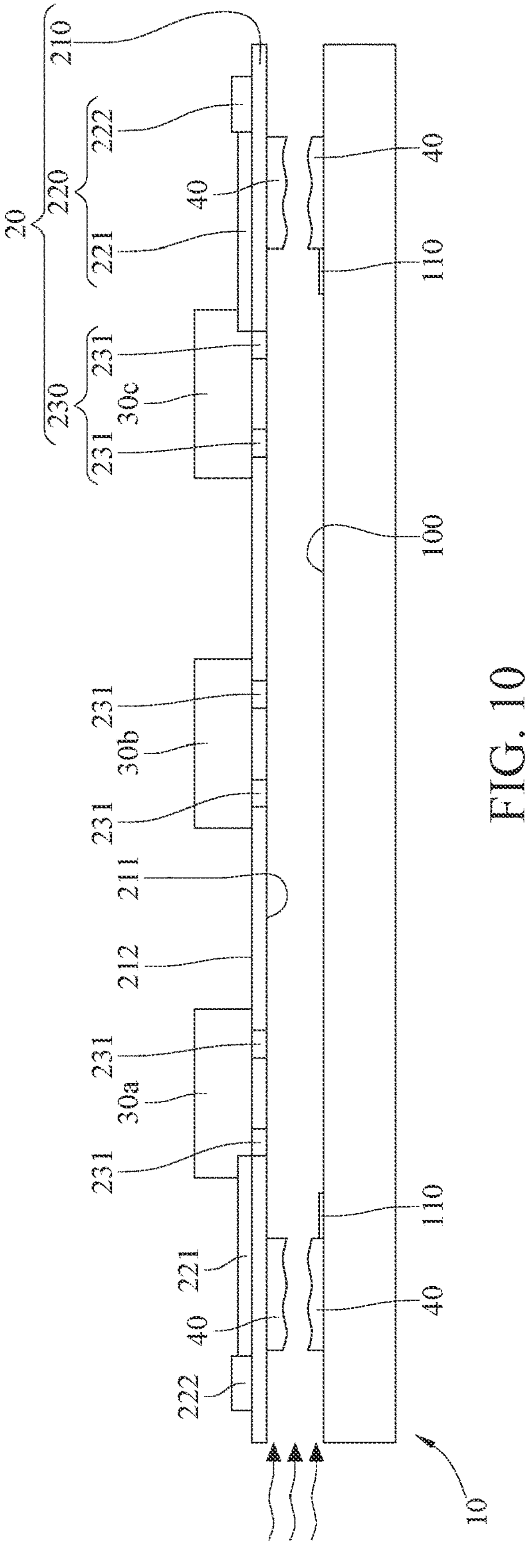
FIG. 10 is a schematic view of repairing the display module in FIG. 6.

In this embodiment, if the micro light emitting elements 30*a*, 30*b*, 30*c* are determined to be unqualified, a repairing procedure may be performed. FIG. 10 is a schematic view of repairing the display module in FIG. 6. Specifically, the interposer 20 and the substrate 10 can be separated from each other by removing or destroying the electrical connection element 40. Then, a replacement (not shown in the drawings) of the interposer 20 is provided to be connected with the substrate 10, thereby accomplishing the repairing procedure. More specifically, the solder of the electrical connection element 40 may be melted by heating to separate the interposer 20 from the substrate 10. The micro light emitting elements of a new interposer (the replacement) may be pre-tested to ensure their quality, or the electrical characteristics of the micro light emitting elements may be tested after the new interposer is bonded with the substrate 10 by a soldering process.

In this embodiment, any one of the micro light emitting elements 30*a*, 30*b*, 30*c* defines a first projection on the surface 100 of the substrate 10, any one of the electrical connection elements 40 defines a second projection on the surface 100, and the first projection does not overlap the second projection. That is, each of the micro light emitting element 30*a*, 30*b*, 30*c* may be non-coaxial with respect to the electrical connection element 40. Therefore, it is helpful to reduce thermal impact on the testing circuit 220 and the electrically conductive structure 230 when the solder of the electrical connection element 40 is heated during the repairing procedure.

According to the present disclosure, the display module includes an interposer where one or more micro light emitting elements are located. The interposer includes a testing circuit and an electrically conductive structure, the testing circuit is configured for an electrical test procedure to determine the quality of the micro light emitting element, and the electrically conductive structure electrically connects the driving circuit with the micro light emitting element. The simple configuration in which the interposer is bonded with the target substrate enables simultaneous transfer of multiple micro light emitting elements to the target substrate, thereby improving transfer efficiency. In addition, the testing circuit formed on the interposer allows for the electrical test of the micro light emitting elements before their transfer so as to prevent thermal damage to the target substrate due to laser energy that is needed for repairing after the transfer.

Furthermore, in one embodiment of the present disclosure, the micro light emitting element may be repaired by separating the interposer from the target substrate. Therefore, in the repairing procedure, it is only necessary to heat the bonding material (such as the metal solder) between the target substrate and the interposer, thereby avoiding heating the target substrate and causing thermal damage to the driving circuit.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A display module, comprising:

a substrate, having a driving circuit;

an interposer, comprising an interlayer, a circuitry, a testing pad and an electrically conductive structure, wherein the circuitry, the testing pad and the electrically conductive structure are located at the interlayer, the circuitry and the testing pad are electrically connected to each other, and the driving circuit is electrically connected with the electrically conductive structure; and a plurality of micro light emitting elements, located at the interposer, wherein the testing pad is electrically connected to the plurality of micro light emitting elements through the circuitry, and the plurality of micro light emitting elements are electrically connected to the electrically conductive structure;

wherein the testing pad is not part of an electrical connection path through which the driving circuit is electrically connected to the plurality of micro light emitting elements.

2. The display module according to claim 1, wherein the substrate is a target substrate where the interposer and the plurality of micro light emitting elements are transferred.

3. The display module according to claim 1, wherein the electrically conductive structure of the interposer extends through the interlayer.

4. The display module according to claim 1, wherein the plurality of micro light emitting elements are one-piece formed on the interlayer.

5. The display module according to claim 1, wherein the interlayer of the interposer has a first surface and a second surface opposite to each other, the first surface faces toward the substrate, and the circuitry and the testing pad are located on the first surface.

6. The display module according to claim 1, wherein the interlayer of the interposer has a first surface and a second surface opposite to each other, the first surface faces toward the substrate, and the circuitry and the testing pad are located on the second surface.

7. The display module according to claim 1, further comprising an electrical connection element between the substrate and the interlayer, wherein the driving circuit is electrically connected with the electrically conductive structure through the electrical connection element.

8. The display module according to claim 7, wherein the electrical connection element comprises metal solder.

9. The display module according to claim 7, wherein a projection of each of the plurality of micro light emitting elements onto a surface of the substrate does not overlap a projection of the electrical connection element onto the surface.

10. The display module according to claim 1, furthering comprises a protective layer disposed on the interposer, wherein the protective layer covers the plurality of micro light emitting elements, and the protective layer and the interlayer together encapsulate the plurality of micro light emitting elements.

11. The display module according to claim 10, wherein the protective layer and the circuitry are located at opposite sides of the interlayer, respectively, and the testing pad and the circuitry are located at a same side of the interlayer.

12. The display module according to claim 1, further comprising a buffer layer between the substrate and the interlayer of the interposer.

13. A method for fabricating the display module according to claim 1, comprising:

providing a semi-finished product of the display module, the semi-finished product comprising:

the interposer; and the plurality of micro light emitting elements;

performing an electrical test procedure, wherein a testing signal is transmitted to the plurality of micro light emitting elements through the circuitry and the testing pad to determine quality of the plurality of micro light emitting elements; and determining the plurality of micro light emitting elements are qualified, then performing a bonding procedure wherein the electrically conductive structure is electrically connected with the driving circuit of the substrate.

14. A method for repairing display module, comprising:

providing the display module according to claim 1;

performing an electrical test procedure, wherein a testing signal is transmitted to the plurality of micro light emitting elements through the circuitry and the testing pad to determine quality of the plurality of micro light emitting elements; and if at least one of the plurality of micro light emitting elements is determined to be unqualified, performing a repairing procedure, wherein the interposer is separated from the substrate, and a replacement of the interposer is connected with the substrate.

* * * * *